Jan. 24, 1956 G. FREEDMAN 2,732,519

METHODS OF MAKING TRANSISTORS AND ASSEMBLY THEREOF

Filed Dec. 19, 1952

INVENTOR
GEORGE FREEDMAN
BY Elmer J. Gorn
ATTORNEY

United States Patent Office 2,732,519

Patented Jan. 24, 1956

2,732,519

METHODS OF MAKING TRANSISTORS AND ASSEMBLY THEREOF

George Freedman, Newton, Mass., assignor to Raytheon Manufacturing Company, Newton, Mass., a corporation of Delaware Application December 19, 1952, Serial No. 326,947

7 Claims. (Cl. 317—235)

This invention relates to a method of making transistors by the application of a force to a section of an n-type semi-conductor body and to an assembly for such transistors.

In the manufacture of transistors, the problem of easily forming p-type and n-type sections within a semiconductor body and assembling the transistor components has become an important consideration. This invention involves a novel method of forming a p-type section within an n-type semiconductor body of single-crystal structure by applying a force to a small section of the semiconductor body, thereby distorting the normal lattice structure of the n-type semiconductor crystal to form a p-type section within the small section. The invention also involves a novel structure to apply and maintain the force on the p-type section of the semiconductor body and to house the transistor components. Since the p-type section formed may lie anywhere along the semiconductor body, any combination of n-type and p-type sections may be made. Therefore, where the term "transistor" is used in the specification and claims, it should be understood that the term is not limited to the more complex transistors, such as the n-p-n type, but includes the semiconductor diodes of the n-p type as well. Also where the term "stress" is used, it should be defined as a force tending to cause a sliding action to occur between contiguous planes in a crystalline body.

This invention and the features thereof will be understood more clearly and fully from the following detailed description of two embodiments of the invention with reference to the accompanying drawing, in which.

Figure 1:
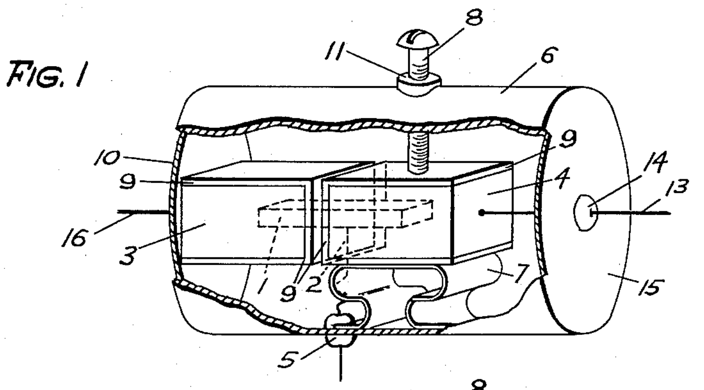
Fig. 1 is a diagram illustrating, on a greatly enlarged scale, the apparatus for forming and housing an n-p-n type junction transistor.
Figure 2:
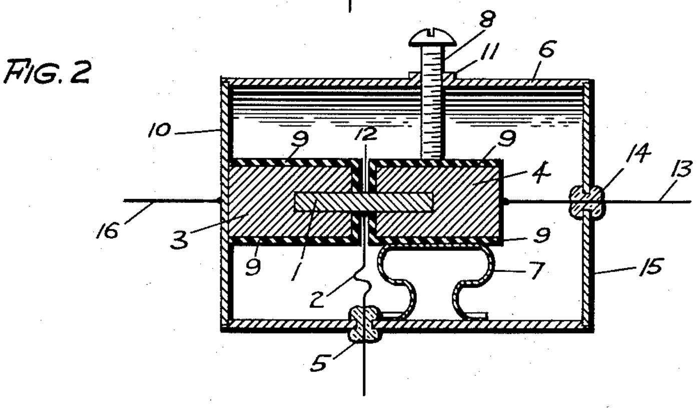
Fig. 2 is a cross-sectional view of Fig. 1.

Referring now to Figs. 1 and 2, one embodiment of this invention is shown as an apparatus to form and maintain a p-type section in an n-type semiconductor body, which apparatus may be enclosed in a tubular case to house a complete n-p-n type transistor. An n-type semiconductor body 1 of single-crystal structure having a wire lead 2 bonded to a point intermediate the ends of the semiconductor body is supported at both ends by a pair of holding members 3 and 4. The semiconductor body 1 may be any semiconductor material, such as germanium or silicon, but should be of the n-type; that is, it should contain a trace of an n-type impurity element, such as arsenic, selected from the fifth periodic group. Although a rectangular bar of n-type germanium has been used for purposes of illustrating this invention, other shaped semiconductor bodies which will react favorably to a shearing stress could be used as well. The lead 2 may be any conducting material that can be firmly bonded to the semiconductor body 1, but the lead should have a diameter of the order of .001 inch to make contact with the small p-type section to be formed. Gold bonding techniques may be used to connect the lead 2 to a semiconductor body of n-type germanium. The lead 2 is run through an insulator 5 in the bottom of a tubular case 6 which houses the transistor parts.

The semiconductor body 1 is fitted into the holding members 3 and 4 so that the inner faces of these members are separated by a distance of the order of .001 inch. Thus the length of the exposed section 12 of the semiconductor body 1 lying between the holding members 3 and 4 will also be of the order of .001 inch. This distance is important because it is desirable to form a very small p-type section in this exposed section of the semi-conductor body 1. The holding members 3 and 4 may be made of any conducting material, such as iron or nickel, and should be insulated from each other, as well as from the lead 2, the spring 7 and the screw 8 to prevent the possibility of a short circuit. Therefore, the inner, top, and bottom faces of the holding members 3 and 4 should be covered with any suitable insulating material 9, such as hard rubber, for example. Since the holding member 4 should also be insulated from the tubular case 6, which is made of conducting material, the holding member 4 should be positioned so that its uninsulated faces do not touch the sides of the case 6. The holding member 4 is positioned so that it rests evenly on the spring 7, and the holding member 3 is soldered to a back wall 10 of case 6. The screw 8, which enters the case 6 through a threaded collar 11, is turned until it meets the top face of the holding member 4. The screw 8 is centered above the holding member 4 so as to evenly distribute a force on the upper face of this member.

A force is exerted on the holding member 4 by rotating the screw 8, and this force is in turn transferred to a section 12 of the semiconductor body 1 which lies between the inner faces of the holding members 3 and 4. Thus a shearing stress will act upon the section 12 to distort the crystalline lattice structure of this section. It is this lattice distortion that changes the section 12 of the n-type semiconductor body 1 to the p-type state. The shearing stress exerted on the section 12 should be great enough to distort the crystalline lattice structure of the n-type semiconductor body 1, but should be less than that needed to reach the elastic limit of the body. By connecting the semiconductor body 1 in an ordinary grounded emitter circuit and testing its electrical characteristics, for example, the gain, the force to be exerted on the holding member 4 can be determined and adjusted accordingly. When the characteristics are satisfactory, the screw 8 may be permanently positioned by sealing the collar 11 with solder. A lead 13 is connected to the holding member 4 and is passed through an insulator 14 in a cover 15 which is then soldered to the rim of the case 6. The entire case 6 is moisture-proofed by sealing the insulators 5 and 14. If desired, an additional lead 16 may be connected to the outer face of the back wall 10, although the case 6 itself may act as a conductor to the n-type section lying within the holding member 3. Thus there are the leads 13 and 16 connected to n-type sections of semiconductor material lying within the holding members 3 and 4, and a base lead 2 connected to a p-type section 12, thereby constituting an n-type junction transistor.

Figure 3:
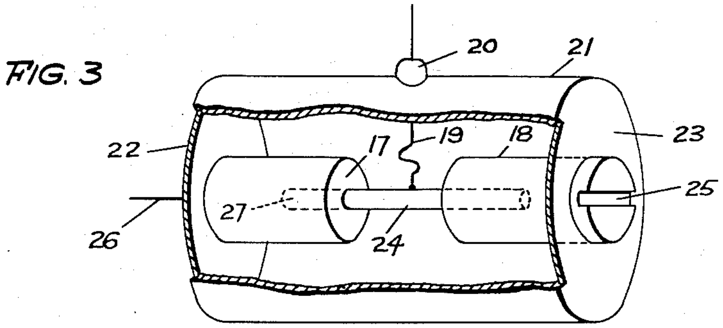
Fig. 3 is a diagram illustrating, on a greatly enlarged scale, the apparatus for forming and housing an n-p type transistor.

Fig. 3 shows another embodiment of this invention in the form of an apparatus which forms and maintains a p-type section in a cylindrical n-type semiconductor body. However, this embodiment differs from the preceding one in that an n-p-type transistor is formed rather than the n-p-n type. A semiconductor body 27 of single-crystal structure having a cylindrical shape is supported at both ends by a pair of holding members 17 and 18. The comments made previously in regard to semiconductor body 1 in Figs. 1 and 2 apply to the semiconductor body 27. However, in this application of the invention, the semiconductor body 27 should be soldered into the holding members 17 and 18 to prevent it from rotating, but the spacing between the holding members is not critical as it was in the preceding illustration. A wire lead 19 is connected to a section 24 of the semiconductor body 27 lying between the holding members, as was the lead 2 in Figs. 1 and 2, and the lead 19 is threaded through an insulator 20 in a tubular conducting case 21. The holding member 17 is soldered to a back wall 22 of the case 21. A cover 23 is fitted over the section of the holding member 18 extending out of the case 21, and is soldered to the rim of the case 21. The holding member 18 is provided with an inset 25 for turning the holding member. Thus, a torque may be exerted on the holding member 18 and this torque will be transferred in turn to the section 24 of the n-type semi-conductor body 27. Crystalline lattice distortion will occur in the section 24 and a coaxial p-type layer will be formed in the area along and near the surface of the section 24. This p-type layer does not extend all the way through the section 24, so essentially the two n-type sections enclosed in the holding members 17 and 18 are still connected by a small n-type layer running through the center of the section 24. By testing the electrical characteristics of the semiconductor body 27, as to its rectifying action, for example, the torque necessary to form the p-type layer can be determined, and the elastic limit of the semiconductor body can be approached without danger of reaching or exceeding it. When the electrical characteristics are correct, the torque on the section 24 may be maintained by soldering the holding member 18 into place. It should be noted that the holding member 18 should be soldered into place in order to retain the desired lattice distortion in the section 24. If the force exerted by turning the holding member 18 is not maintained, the crystalline structure in the p-type section 24 will revert to the n-type state. If desired, a lead 26 may be connected to the case 21, although the case itself acts as a conductor to the n-type section of the semiconductor body 27. Thus, an n-p type transistor is formed and appropriately packaged for use.

It should be understood that this invention is not limited to the particular details as described above, as many equivalents will suggest themselves to those skilled in the art. For example, the cases 6 and 21 need not be tubular but could be cube-shaped, and, as stated previously, the semiconductor bodies 1 and 27 can be varied as to the n-type impurity elements selected. The shapes of the semiconductor bodies can also be changed to react properly to varying types of forces and need not be subjected only to shearing stresses and torques. The means for exerting a shearing stress on the section 12 in Fig. 1 need not be limited to the screw and spring control as shown, but could be modified in any way suitable for the purposes of this invention. Likewise, the means to apply a force to the section 24 in Fig. 3 may be varied as desired. Also, the n-type and p-type sections can be increased to form more complex junctions within the same semi-conductor body and are not limited to the n-p-n type and n-p type junctions shown. Therefore, it is desired that the appended claims be given a broad interpretation commensurate with the scope of the invention within the art.

What is claimed is:

1. A transistor assembly comprising an n-type single crystal semiconductor body, means for applying and maintaining a stress on a section of said body to change said section to the p-type state and to retain said section in said state, and leads connected to said section and said body.

2. A transistor assembly comprising an n-type single crystal semiconductor body composed of an element selected from the group consisting of germanium and silicon and a trace of an n-type impurity element selected from the fifth periodic group, means for applying and maintaining a stress on a section of said body to change said section to the p-type state and to retain said section in said state, and leads connected to said section and said body.

3. A transistor assembly comprising an n-type single crystal semiconductor body supported by fixed and movable holding members, means for applying and maintaining a stress on said movable member whereby said stress is transferred to a section of said body intermediate said holding members to change said section to the p-type state and retain said section in said state, and leads connected to said section and said body.

4. A transistor assembly comprising an n-type single crystal semiconductor body, means for holding said body, means for applying and maintaining a stress on a section of the order of .001 inch of said body to change said section to the p-type state and retain said section in said state, and leads connected to said section and said body.

5. A transistor assembly comprising an n-type single crystal semiconductor body, means for applying and maintaining a stress on a section of said body to change said section to the p-type state, locking means engaging said section to retain said section in said state, said locking means being movably secured to and extended through a case enclosing the components of said assembly, leads connected to the n-type and p-type sections of said body, and means for insulating said leads.

6. A transistor assembly comprising an n-type single crystal semiconductor body, means for applying and maintaining a shearing stress on a section of said body to change said section to the p-type state and to retain said section in said state, and leads connected to said section and said body.

7. A transistor assembly comprising an n-type semiconductor body, means for applying and maintaining a torque on a section of said body to change said section to the p-type state and to retain said section in said state, and leads connected to said section and said body.

References Cited in the file of this patent

UNITED STATES PATENTS

| | | |
|---|---|---|
| 2,530,110 | Woodyard | Nov. 14, 1950 |
| 2,563,503 | Wallace | Aug. 7, 1951 |
| 2,595,475 | McLaughlin | May 6, 1952 |